(12) United States Patent
Yamashita (10) Patent No.: US 6,483,042 B2
(45) Date of Patent: Nov. 19, 2002

(54) SUBSTRATE FOR MOUNTING SEMICONDUCTOR INTEGRATED CIRCUIT DEVICE

(75) Inventor: Takeshi Yamashita, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/983,502

(22) Filed: Oct. 24, 2001

(65) Prior Publication Data

US 2002/0050406 A1 May 2, 2002

(30) Foreign Application Priority Data

Oct. 27, 2000 (JP) ........................................ 2000-329596

(51) Int. Cl.[7] ................................................ H05K 1/16
(52) U.S. Cl. ........................ 174/260; 174/261; 361/767; 361/774
(58) Field of Search ................................ 174/250, 260, 174/261; 361/767, 777, 779, 772, 774, 778, 768

(56) References Cited

U.S. PATENT DOCUMENTS

| | | | | |
|---|---|---|---|---|
| 5,422,441 A | * | 6/1995 | Iruka ........................... | 174/250 |
| 5,780,925 A | * | 7/1998 | Cipolla et al. ............... | 257/676 |
| 6,121,681 A | * | 9/2000 | Tanaka et al. ............... | 257/636 |
| 6,282,098 B1 | * | 8/2001 | Totani et al. ................ | 174/250 |
| 6,313,413 B1 | * | 11/2001 | Chen et al. .................. | 174/261 |
| 6,384,346 B1 | * | 5/2002 | Chang et al. ................ | 174/260 |

OTHER PUBLICATIONS

"Sharp Integrated Circuits", '00/'01, Sharp Corp. p. 53 Sep. 2000.

"Hitachi LCD Driver LSI Databook", Applied Technology Sector of Hitachi Microcomputer System Co. Ltd. the sixth edition, p. 36–39 and 63, Mar. 1992.

* cited by examiner

Primary Examiner—Kamand Cuneo
Assistant Examiner—José H. Alcala
(74) Attorney, Agent, or Firm—Birch, Stewart, Kolasch & Birch, LLP

(57) ABSTRACT

Test terminals connected to output lead sections are divided into blocks, and in each of the blocks, an outermost pair of the test terminals extends inwards from the output lead sections to oppose each other, and the pair is located relatively far from a place where a liquid crystal driver LSI chip is mounted.

15 Claims, 6 Drawing Sheets

SUBSTRATE FOR MOUNTING SEMICONDUCTOR INTEGRATED CIRCUIT DEVICE

FIELD OF THE INVENTION

The present invention relates to a substrate for mounting a semiconductor integrated circuit device such as a film carrier tape on which a semiconductor integrated circuit device for driving a display panel.

BACKGROUND OF THE INVENTION

COG (Chip On Glass) mounting method and TCP (Tape Carrier Package) mounting method are conventionally known as methods to mount an integrated circuit chip for driving liquid crystal (will be referred to as liquid crystal driver LSI chip) on a liquid crystal display. The COG mounting method is to mount a liquid crystal driver LSI chip directly on a lower glass substrate of a liquid crystal panel.

On the other hand, the TCP mounting method is to mount a liquid crystal driver LSI chip on an insulating film using TCP technique. In this method, the insulating film includes a copper wiring pattern, and a part of the pattern jutting into a device hole section formed on the film is called an inner lead section.

Tips of these inner lead sections are electrically connected to electrodes (bumps) of a liquid crystal driver LSI chip situated in the device hole section. Also, the insulating film includes a copper wiring for electrical connection to the outside, i.e. an outer lead section. A tip of this outer lead section is electrically connected to a liquid crystal panel or a wiring substrate.

For instance, provided that a TCP and a liquid crystal panel are electrically connected, the outer lead section is bonded to ITO (Indium Tin Oxide) terminal on a lower glass substrate of the panel via such as ACF (Anisotropic Conductive Film) by thermocompression.

On account of this, multiple TCP-type liquid crystal driver LSI chips are mounted on a periphery of the liquid crystal panel, and the panel is driven.

Figure 5:
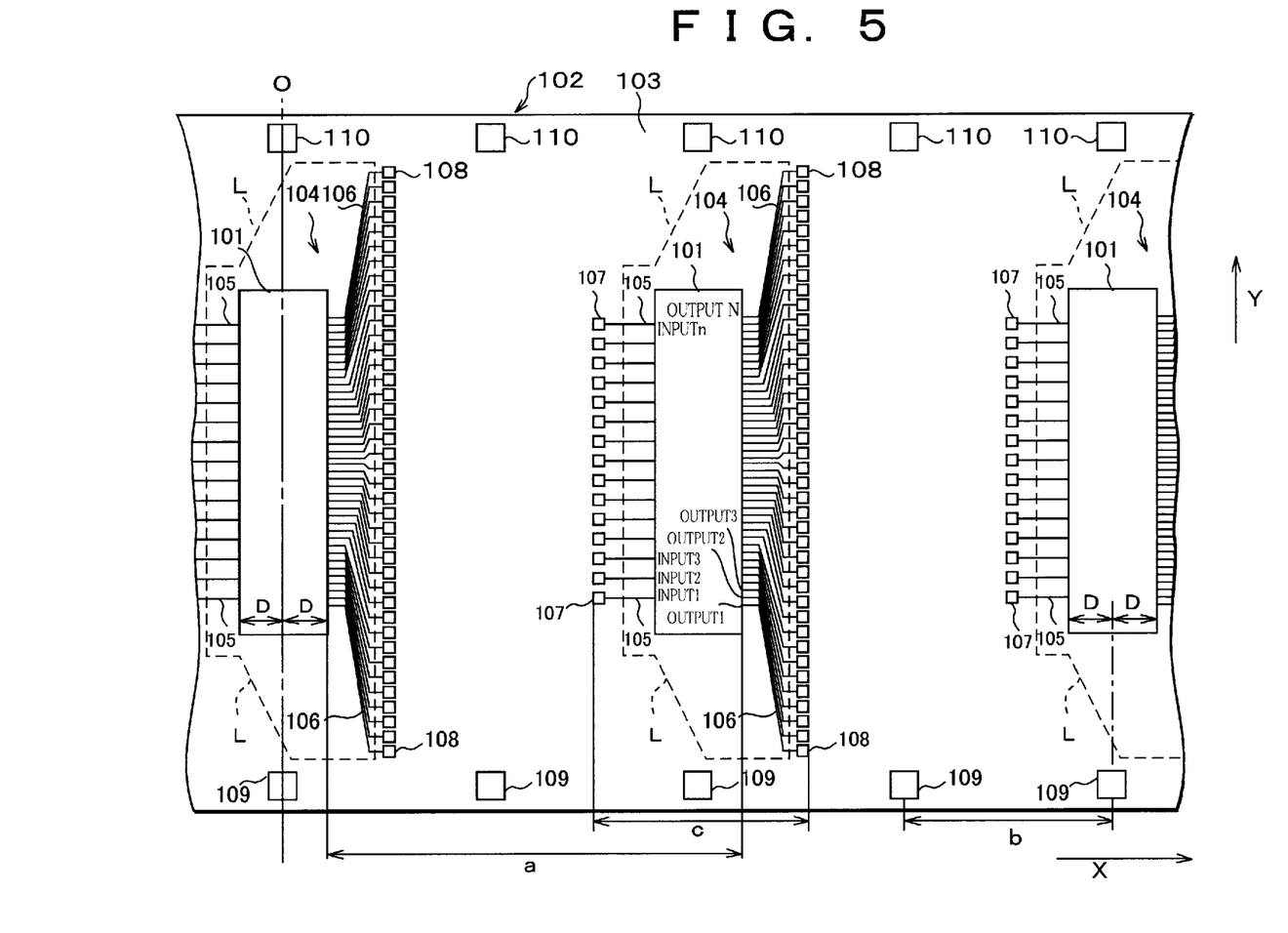
FIG. 5 is a schematic plan view showing an arrangement of a conventional film carrier tape on which a liquid crystal driver LSI chip is mounted.

FIG. 5 schematically shows a liquid crystal driver LSI chip 101 being mounted on a film carrier tape 102, to form a TCP. The film carrier tape 102 is formed by setting a predetermined wiring pattern on a band-shaped insulating film carrier tape substrate 103.

The film carrier tape 102 is torn off along broken line L shown in FIG. 5, to form TCP 104 each containing a liquid crystal driver LSI chip 101.

Since many output terminals are arranged along the output side of the liquid crystal driver LSI chip 101, the chip looks like an extremely slim rectangle, if viewed from above. Therefore, the liquid crystal driver LSI chip 101 is typically mounted so that its longer side lies across the film carrier tape 102 (in Y direction).

The liquid crystal driver LSI chips 101 are mounted in a single line with a predetermined interval (distance a) between each other along the length (X direction) of the film carrier tape 102.

On the film carrier tape substrate 103, input lead sections 105 and output lead sections 106 are formed as the wiring pattern described above, to connect the liquid crystal driver LSI chip 101 to other devices.

The input lead sections 105 are for receiving a signal to the liquid crystal driver LSI chip 101. The output lead sections 106 are for transmitting a driving signal from the liquid crystal driver LSI chip 101 to a liquid crystal panel.

Furthermore, input test terminals (pads) 107 are formed on tips of the input lead sections 105. Output test terminals 108 (pads) are formed on tips of the output lead sections 106.

The input test terminals 107 and the output test terminals 108 are used for making contact with probes of a wafer prober, when the liquid crystal driver LSI chip 101 is examined.

That is to say, when the liquid crystal driver LSI chip 101 is examined, control signals for various testing coming from an external testing device, reference voltages for a gray scale, and power supply of the liquid crystal driver LSI are fed from the probes of the wafer prober to the liquid crystal driver LSI chip 101 via the input test terminals 107.

Then an output signal (mainly an output signal for driving the liquid crystal panel) from the liquid crystal driver LSI chip 101 is input to the testing device from the output test terminals 108 via the probes of the wafer prober, to examine response characteristics of the output signal and output voltage error.

By doing this, the quality of the liquid crystal driver LSI chip 101 including its condition of mounting on the film carrier tape 102 is judged.

By the way, after the testing, the input test terminals 107 and the output test terminals 108 are cut off from the TCP 104, when the film carrier tape 102 is torn off along broken line L to obtain the TCPs 104.

By this cutting-off, tips of the input lead sections 105 and the output lead sections 106 of the TCP 104 become outer lead sections with their solder resists uncovered. The outer lead sections are made to be electrically connected with the liquid crystal panel or other wiring substrates as described above.

Moreover, in the film carrier tape substrate 103, sprocket holes 109 are made along one edge of the substrate and sprocket holes 110 are also made along the other edge, both at regular intervals. The sprocket holes 109 and 110 are symmetrically located in X direction.

These sprocket holes 109 and 110 are used to transport the film carrier tape substrate 103 by using sprockets, and also to align the liquid crystal driver LSI chip 101 when mounting.

Each liquid crystal driver LSI chip 101 is mounted so that a middle point of line O (connecting in Y direction through centers of both sprocket holes 109 and 110) and the center of the chip 101 are matched (see the chip 101 on the left side of the figure).

Therefore, in X direction, the liquid crystal driver LSI chips 101 are situated so that a pitch between the chips is an integral multiple of a pitch between the sprocket holes 109 and 110 (distance b in the figure).

The pitch between the sprocket holes 109 and 110 (b in the figure) is set at 4.75 mm by JIS, the Japanese Industrial Standards. So, if the distance from the edge of the input test terminals 107 to the edge of the output test terminals 108 (distance c in the figure) is set at 6.0 mm, one liquid crystal driver LSI chip 101 can be mounted at every two pitches of the sprocket hole 109 and 110, to accommodate as many chips as possible.

Now, an arrangement of the input test terminals 107 and the output test terminals 108 is described. Since the input lead sections 105 (input test terminals 107) are fewer than the output lead sections 106 (output test terminals 108), as FIG. 5 shows, the input lead sections 105 are arranged in a single line in Y direction.

On the other hand, the number of required output lead sections 106 (output test terminals 108) in one liquid crystal driver LSI chip 101 is decided in accordance with a number of pixels of the liquid crystal panel corresponding to each color of red, green and blue. For instance, 128×3=384 output lead sections 106 (shown as output 1 to output N in the figure) are required to drive 384 pixels. Thus the output lead sections 106 (output test terminals 108) are considerably large in number.

Also, as the number of the pixels have increased in accordance with upsizing and improvement of the resolution of the liquid crystal panel, the number of the output lead sections 106 (output test terminals 108) in one liquid crystal driver LSI chip 101 has been increasing.

Hence if the output test terminals 108 are arranged in a single line in Y direction as FIG. 5 shows, it is impossible to accommodate all of them within the width of the film carrier tape substrate 103.

Figure 6:
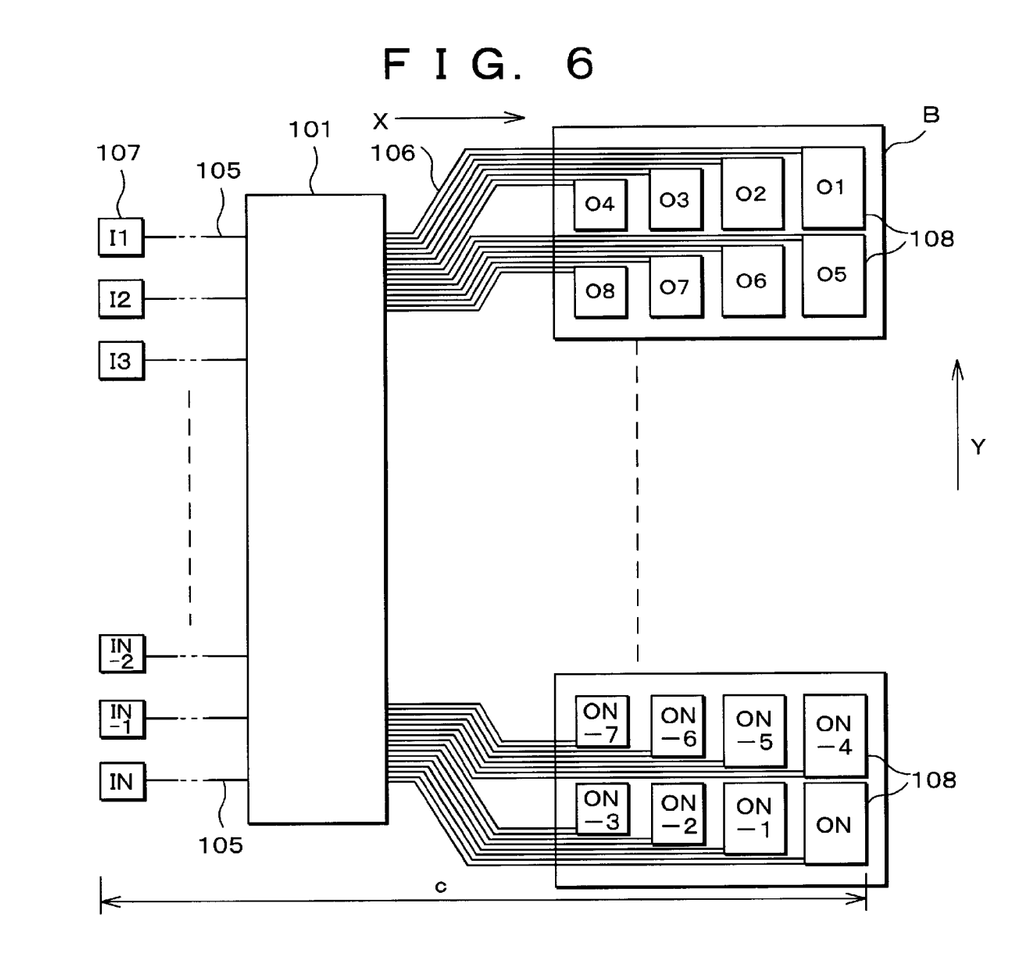
FIG. 6 is an explanatory view describing an arrangement that output test terminals of the film carrier tape shown in FIG. 5 are arranged in several tiers.

Thus, in practical use the output test terminals 108 are arranged in four tiers in X direction as FIG. 6 shows. (See FIG. 27 (Hitachi standard TCP) of "Hitachi LCD Driver LSI Databook": the sixth edition, published by Applied Technology Sector of Hitachi Microcomputer System Co. Ltd., in March 1992)

In this case, since an area in which the output test terminals 108 are arranged expands in X direction of the film carrier tape 102, distance c becomes longer. By the way, numbers I1, . . . , I(N-1), IN and O1, . . . , O(N-1), ON are assigned to describe how N input test terminals 107 and N output test terminals 108 are arranged.

In the multi-tier arrangement of the output test terminals 108 in X direction as above, the number of required tiers depends on the minimum allowed size of the terminal 108 and the width of the TCP 104. The minimum allowed size of the output test terminal 108 is decided by a number of the output terminals of the liquid crystal driver LSI chip 101 and a pitch between the probes of the wafer prober.

To cut costs in producing a liquid crystal display device, an arrangement that has recently been studied is to increase the number of output terminals of the liquid crystal driver LSI chip 101, at the same time decrease the number of required liquid crystal driver LSI chips 101 for one liquid crystal display.

For this arrangement, the multi-tier arrangement of the output test terminals 108 is absolutely necessary, so the terminals are arranged in four tiers or six tiers or even more, depending on the number of the output terminals.

However, the conventional arrangement of the film carrier tape 102 has problems as follows:

since the output test terminals 108 are arranged in several tiers along the length of the film carrier tape substrate 103 (in X direction), distance c from the edge of the input test terminals 107 to the edge of the output test terminals 108 becomes longer.

So the length of the film carrier tape 103 necessary for each liquid crystal driver LSI chip 101 becomes longer as well.

The length of the film carrier tape substrate 103 becomes even longer, because the pitch between the chips 101 has to be an integral multiple of the pitch between the sprocket holes 109 and 110 that is required to be 4.75 mm by the regulation.

Therefore, the film carrier tape substrate 103 cannot be utilized efficiently, and the cost for each TCP 104 becomes higher.

SUMMARY OF THE INVENTION

An object of the present invention is to offer a substrate for mounting a semiconductor integrated circuit device realizing cost-reduction of a per-unit price of TCPs, by utilizing a film carrier tape substrate (insulating substrate) efficiently.

In order to fulfil the above, the substrate for mounting a semiconductor integrated circuit device of the present invention contains:

lead sections formed on the insulating substrate and connected to at least one of an input terminal and an output terminal of a mounted semiconductor integrated device; and a test terminal formed on a tip of each of the lead sections, wherein:

the lead sections and the test terminals are divided into blocks, and in each of the blocks, an outermost pair of the test terminals extends inwards to oppose each other and is located relatively far from a place where the semiconductor integrated circuit device is mounted.

In the arrangement above, one block includes the test terminals corresponding to some of the lead sections which are connected to output terminals of the semiconductor integrated circuit device.

Two test terminals connected to the outermost lead sections are paired, and extend inwards to oppose each other.

Also, the pair of the test terminals is located relatively far from a place where the semiconductor integrated circuit device is mounted.

As a result, a dimension required to form the test terminals and the lead sections on the insulating substrate can be reduced in a direction of a row of the lead sections, by arranging the test terminals connected to the outermost lead sections and setting widths of the test terminals adequately.

On account of this, the insulating substrate can be utilized efficiently, and thus a per-unit price of products mounting semiconductor integrated circuit devices such as a tape carrier package can be reduced.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 4, the following description will discuss an embodiment in accordance with the present invention.

Figure 1:
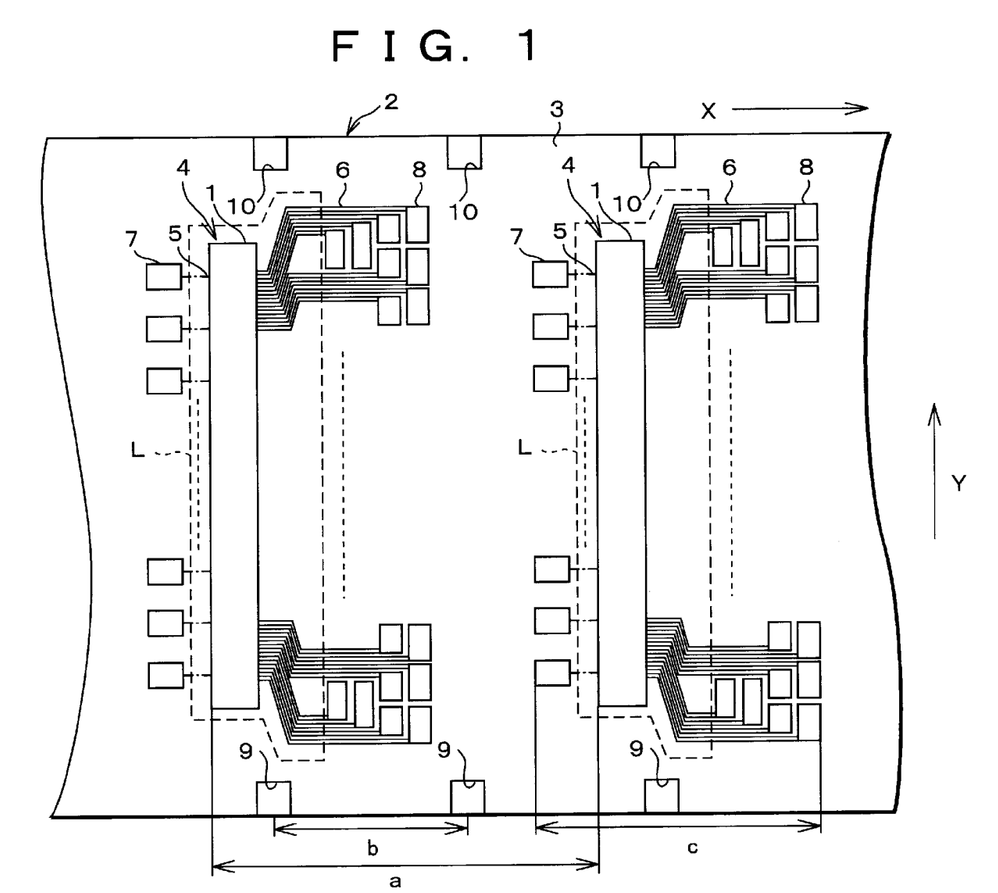
FIG. 1 is a schematic plan view in accordance with an embodiment of the present invention, showing an arrangement of a film carrier tape on which liquid crystal driver LSI chips are mounted.

A substrate for mounting a semiconductor integrated circuit device in accordance with the present embodiment is arranged as a film carrier tape 2 for mounting a liquid crystal driver LSI chip 1 (a semiconductor integrated circuit device), as FIG. 1 shows, for example.

FIG. 1 is a schematic view showing the liquid crystal driver LSI chip 1 being mounted on the film carrier tape 2, to form a TCP (Tape Carrier Package) containing the liquid crystal driver LSI chip 1.

The film carrier tape 2 is formed by setting a predetermined wiring pattern on a band-shaped insulating film carrier tape substrate (insulating substrate) 3.

By the way, a device hole section opened on the film carrier tape substrate 3 is omitted from the figure, because the hole section is below the liquid crystal driver LSI chip 1.

An encapsulating resin to protect the liquid crystal driver LSI chip 1 and a solder resist to protect wiring on a TCP 4 are omitted too. A slit section to allow a film section of the TCP 4 to bend may be formed on the film section, but it is also omitted from the figure.

For instance, a 50 μm thick polyimide film can be used as the film carrier tape substrate 3. In this case, the film carrier tape 2 is formed by laminating a 18 μm thick electrolytic copper foil on the polyimide film (the insulating film carrier tape substrate 3) via an adhesion layer.

A 30 μm minimum line width wiring pattern is formed by conducting Sn plating on the electrolytic copper foil and then patterning the foil. By the way, a wiring pattern of an electrolytic copper foil may be formed directly on the film carrier tape substrate 3 without an adhesion layer.

The film carrier tape 2 is torn off along broken line L shown in the FIG. 1, and on account of this, the TCP 4 on which a liquid crystal driver LSI chip 1 is mounted is formed.

Since many output terminals are arranged along the output side of the liquid crystal driver LSI chip 1, the chip looks like an extremely slim rectangle, if viewed from above.

Therefore, as FIG. 1 shows, the liquid crystal driver LSI chip 1 is mounted so that its longer side lies across the film carrier tape 2 (in Y direction).

The liquid crystal driver LSI chip 1 is mounted in a single line with a predetermined interval (distance a) between each other along the length of the film carrier tape 2 (in X direction).

On the film carrier tape substrate 3, input lead sections (lead sections) 5 and output lead sections (lead sections) 6 are formed as a wiring pattern to connect the mounted liquid crystal driver LSI chip 1 to other devices.

The input lead sections 5 are for receiving a signal to the liquid crystal driver LSI chip 1. The output lead sections 6 are for transmitting a driving signal from the liquid crystal driver LSI chip 1 to a liquid crystal panel.

Furthermore, input test terminals (pads) 7 are formed on tips of the input lead sections 5. Output test terminals (pads) 8 are formed on tips of the output lead sections 6.

As previously discussed, the input test terminals (test terminals) 7 and the output test terminals (test terminals) 8 are used for making contact with probes of a wafer prober, when the liquid crystal driver LSI chip 1 is examined.

After the testing, the input test terminals 7 and the output test terminals 8 are cut off from the TCP 4 to obtain the TCPs 4, when the film carrier tapes 2 are torn off along broken line L. By this cutting-off, tips of the input lead sections 5 and the output lead sections 6 of the TCP 4 become outer lead sections with their solder resists uncovered. The outer lead sections are used to be electrically connected with a liquid crystal panel or another wiring substrate.

On the film carrier tape substrate 3, sprocket holes 9 are made along one edge of the substrate and sprocket holes 10 are also made along the other edge, both at regular intervals.

The sprocket holes 9 and 10 are symmetrically located in X direction. These sprocket holes 9 and 10 are used to transport the film carrier tape substrate 3 by using sprockets, and also to align the liquid crystal driver LSI chip 1 when mounting.

In X direction, the liquid crystal driver LSI chips 1 are situated so that the pitch between the chips is an integral multiple of the pitch between the sprocket holes 9 and 10 (b in the figure). One liquid crystal driver LSI chip 1 can be mounted at every two pitches of the sprocket hole 9 and 10, to accommodate as many chips as possible, as FIG. 1 shows.

Now, an arrangement of the input test terminals 7 and the output test terminals 8 is described. Since the input lead sections 5 (input test terminals 7) are fewer than the output lead sections 6 (output test terminals 8), the lead sections 5 are arranged in a single line in Y direction, as FIG. 1 shows.

On the other hand, since the output lead sections 6 (output test terminals 8) are considerably large in number as described above, the lead sections 6 are mounted by adopting a multi-tier arrangement in X direction. As FIG. 2 shows, the output lead sections 6 are arranged in four tiers in this embodiment.

Figure 2:
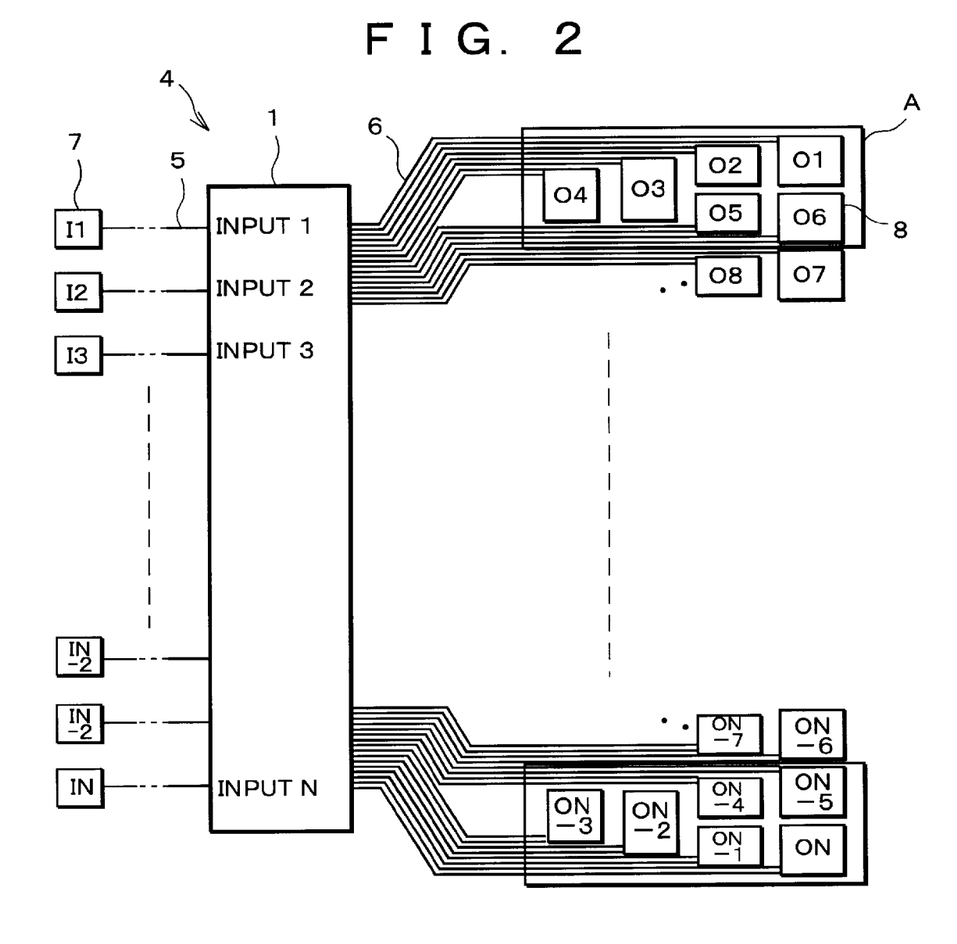
FIG. 2 is a schematic plan view showing an arrangement of one liquid crystal driver LSI chip as shown in FIG. 1 and input/output terminals related to the chip.

In FIG. 2, I1, . . . , I(N−1), IN and O1, . . . , O(N−1), ON are assigned to describe how N input test terminals 7 and N output test terminals 8 are arranged.

A minimum allowed pitch between the output test terminals 8 has become shorter, because of the recent progress of manufacturing technique of the probes of the prober. In other words, it is because a pitch between probes of the wafer prober has become shorter.

Therefore, in the film carrier tape 2 of this embodiment, to keep up with the improvement of the manufacturing technique of the prober and multi-terminalization of the output terminals 8 (output lead sections 6), the film carrier tape substrate 3 is efficiently utilized by shortening a distance from the edge of the input test terminals 7 to the edge of the output test terminals 8 (distance c).

Figure 3:
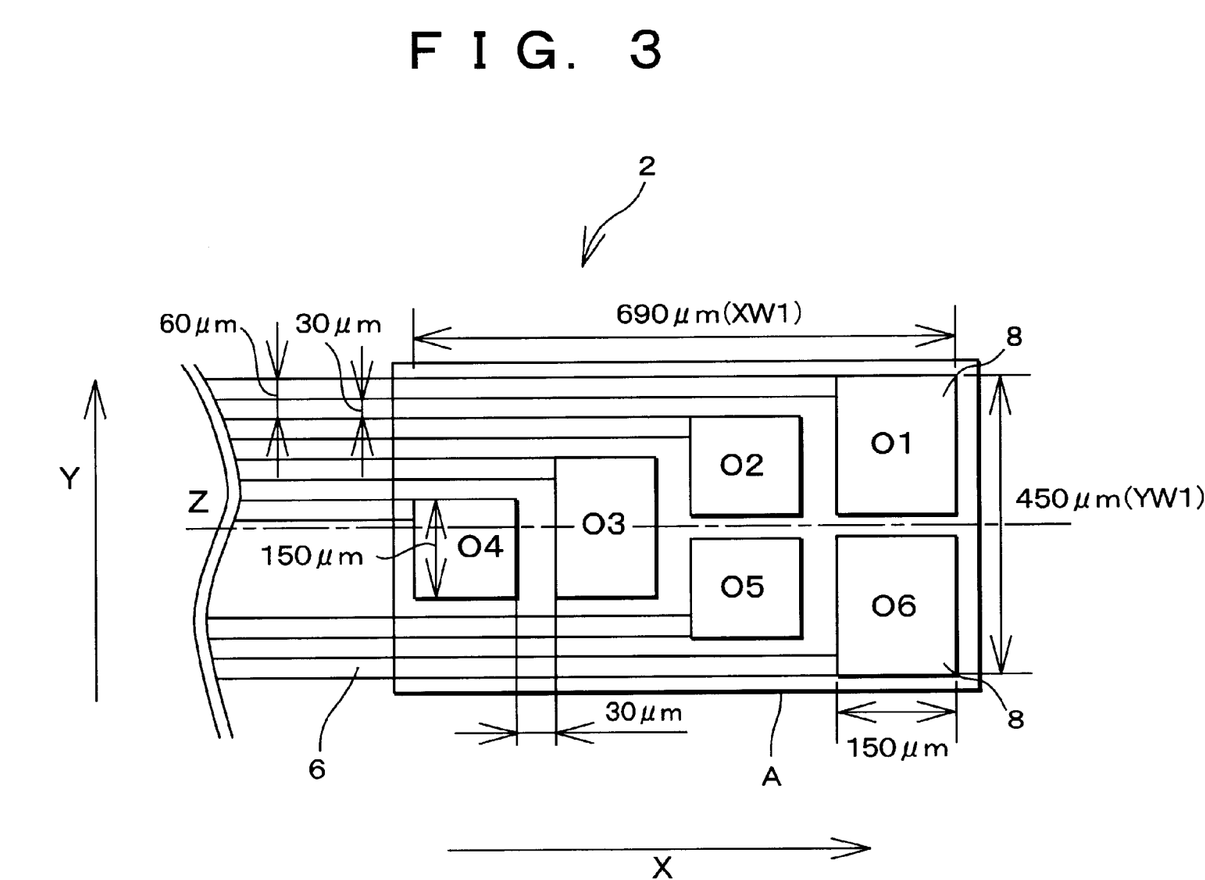
FIG. 3 is an explanatory view describing an arrangement of output lead sections and output test terminals forming one block, as shown in FIG. 2.

FIG. 3 is an explanatory view of the film carrier tape 2, describing an arrangement of the output test terminals 8 in one block (block A).

Figure 4:
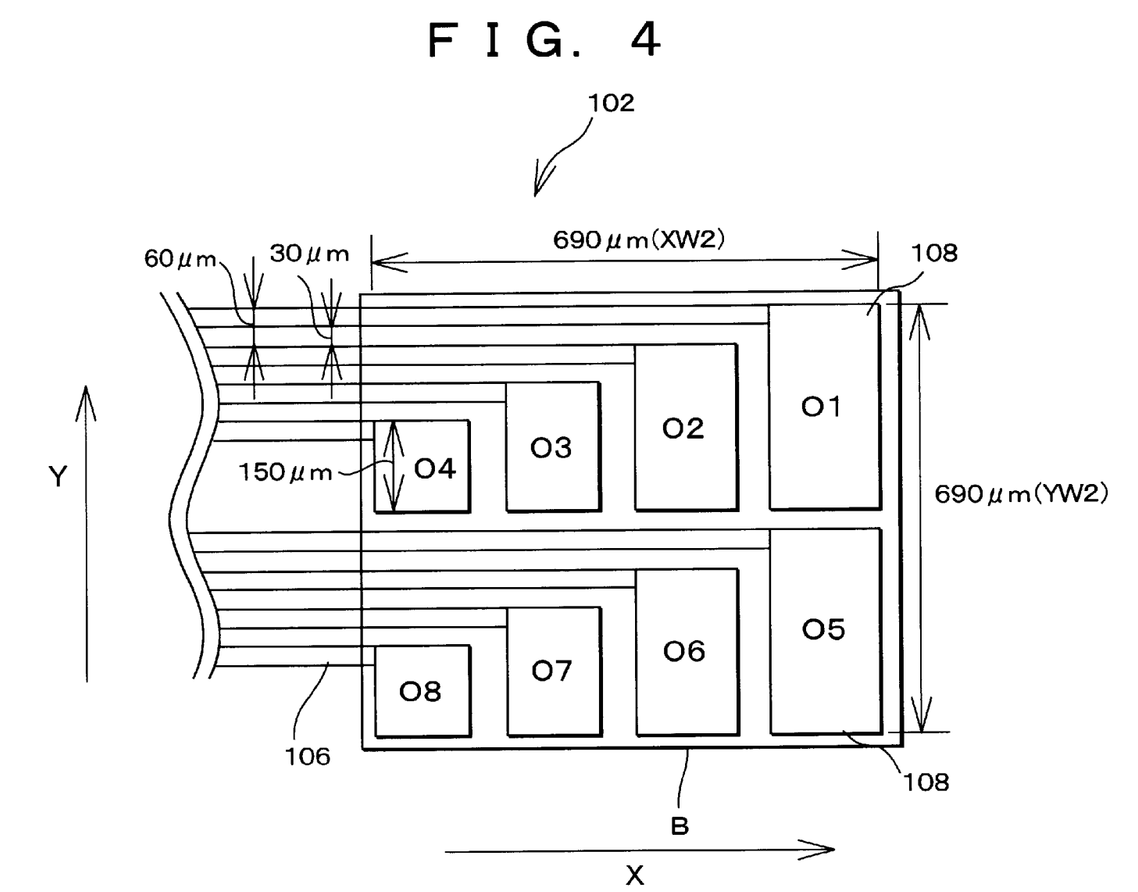
FIG. 4 is a view for comparison with the arrangement shown in FIG. 2, and an explanatory view describing an arrangement of output lead sections and output test terminals forming one block, as shown in FIG. 6.

FIG. 4 is an explanatory view of the film carrier tape 102, showing a conventional arrangement of the output test terminals 108 in one block (block B), for comparing the conventional arrangement with that of the film carrier tape 2 of this embodiment.

FIG. 3 shows that six output lead sections 6 and six output test terminals 8 are contained in one block (block A).

Meanwhile, FIG. 4 shows that eight output lead sections 106 and eight output test terminals 108 are contained in one block (block B).

By the way, numbers from O1 to O6 and from O1 to O8 are assigned to the output test terminals 8 and 108 to increase sequentially in Y direction.

On the film carrier tape 2 shown in FIG. 3, the output terminals O3 and O4 correspond to the inner output lead sections 6. The terminals O3 and O4 are arranged along the length of the film career tape 2 (in X direction), in the same arrangement as the terminals on the conventional film carrier tape 102, as FIG. 4 shows.

The output test terminals 8 (output test terminals O3 and O4) corresponding to the output lead sections 6 aligned inside of the row are formed to extend from the edge of the output lead sections 6 towards the opposite side (center) of block A, in Y direction.

Also, an area where the inner output terminals O3 and O4 are arranged is relatively close to the liquid crystal driver LSI chip 1.

On the other hand, the output test terminals 8 (output test terminals O1, O6 and O2, O5) aligned outside of the row of the output lead sections 6 (in Y direction) are formed to extend from the edge of the output lead sections 6 towards inside of the row of the output lead sections 6, i.e. towards the center.

To be more specific, the outer output test terminals such as O1 and O6, O2 and O5 are arranged to be substantially symmetric with respect to center line Z. Center line Z runs in X direction, dividing block A into two equal parts.

The pair of symmetrically arranged output test terminals O1 and O6 corresponding to the output lead sections 6 situated furthermost from center line Z are placed in an area furthermost from the liquid crystal driver LSI chip 1.

The pair of symmetrically arranged output test terminals O2 and O5 corresponding to the output lead sections 6 placed inside of the pair of the output test terminals O1 and O6 is placed closer to the liquid crystal driver LSI chip 1, comparing to the pair of the output test terminals O1 and O6.

Because of the arrangement of the output lead sections 6 and the output test terminals 8 as above, the output lead sections 6 cannot be provided between the output test terminals 8.

To be more specific, as FIG. 4 shows, the output lead sections 6 on the conventional film carrier tape 102 are arranged as follows:

The output lead section 6 of the output test terminal O5 is arranged between the output test terminals O2 and O6;

The output lead sections 6 of the output test terminals O5 and O6 are arranged between the output test terminals O3 and O7; and The output lead sections 6 of the output test terminals O5, O6 and O7 are arranged between the output test terminals O4 and O8.

However, in the present invention, as FIG. 3 shows, the output lead sections 6 cannot be arranged in the area between the pairs of output test terminals 8 (between the terminals O1 and O6 and between the terminal O2 and O5) on the film carrier tape 2.

That is to say, either of the pair of the output test terminals 8 (the terminals O5 and O6, for instance) is formed to extend towards the area in which the output lead section 6 is not formed (towards inside of the row of the output lead sections 6).

By the way, FIG. 3 shows that six output test terminals 8 are contained in one block (block A), as an example.

Then the pair of the output test terminals 8 (O1 and O6) arranged in outermost of the row of the output lead sections 6 (in Y direction) and the pair of terminals just inside the output test terminals O1 and O6 (the output test terminals O2 and O5) are symmetrically arranged with respect to center line Z.

The sum of twice as much a minimum width of the output test terminal 8 (a minimum width of the test terminal) and a minimum distance between the adjacent output test terminals (a minimum width between O1 and O6: a minimum distance between the terminals) is a necessary length to arrange the terminals symmetrically as above.

In other words, the length required is given by;
the minimum width of the test terminal×2+the minimum distance between the terminals (a symmetrical pattern distance)

That is to say, if the symmetrical pattern distance is secured between the pair of the output test terminals 8 being mirror images of each other in Y direction, the terminals 8 can be arranged symmetrically.

By using the symmetrical pattern, the output test terminals O1 and O6, and the output test terminals O2 and O5 are symmetrically arranged. That is to say, the test terminals O2 and O5 are arranged in an area between the output lead section 6 connected to the output test terminal O1 and the section 6 connected to the terminal O6. As a result, the length of the insulating substrate in the direction of the row of the lead sections (in Y direction), which is required to form the output test terminals 8 and the output lead sections 6, is certainly shortened.

Also, even if one block includes more than or less than 6 output test terminals 8, the arrangement of this invention can be applied. In other words, as long as the output test terminals 8 can be arranged within the symmetrical pattern distance as above, the symmetric arrangement can be realized regardless of a number of the output test terminals.

Moreover, in FIG. 3, from the output lead sections 6, the output test terminals O3 and O4 are both formed to extend from one side towards the other in the direction of the row of the output lead sections 6 (towards center line Z). However, directions of the extension of the terminals are not restricted, as long as the output test terminals O3 and O4 can be arranged between the lead section 6 connected to the output test terminal O2 and the section 6 connected to the terminal O5.

In reference to FIG. 3, the arrangement of the output test terminals O3 and O4 is described in detail.

First of all, block A is divided by center line Z (Z axis), into an upper side (the upper side of Z axis, containing the output test terminals O1 and O2) and a lower side (the lower side of Z axis, containing the output test terminals O5 and O6). These upper and lower sides are used to make the description easier.

The output test terminals O3 and O4 are formed to extend from the lead sections 6 arranged in the upper side of Z axis towards the lower side of the axis.

The output test terminals O3 and O4 may be formed to extend from the lead sections 6 arranged in the lower side of Z axis towards the upper side of the axis.

Furthermore, while the output test terminal O3 is formed to extend from the lead section 6 arranged in the upper side of Z axis towards the lower side of the axis, the output test terminal O4 may be formed to extend from the lead section 6 arranged in the lower side of Z axis towards the upper side of the axis.

In a word, the directions of the extension of the output test leads 8 are decided depending on the arrangement of the output leads 6.

Next, the dimensions of the output test terminals 8 and 108 in one block (block A and B) shown in FIGS. 3 and 4 are described in detail.

A minimum space distance between the adjacent output lead sections 6 and between sections 106 (distances between the facing sides of the adjacent output lead sections 6 and 106) on the film carrier tapes 2 and 102 is determined by etching precision of patterning of the copper wiring to form the output lead sections 6 and 106.

In this embodiment, the minimum space distance is set at 30 μm, and the minimum line width of the output lead sections 6 and 106 is set at 30 μm. Also, a minimum width of the pad, i.e. the output lead terminals 8 (from O1 to O6) and 108 (from O1 to O8), in short the test terminals is set at 150 μm. This width is determined by alignment precision of the probes of the wafer prober.

FIG. 3 shows that on the film carrier tape 2, the output test terminals O1 and O6 are formed to meet the minimum width requirement for the test terminals (150 μm), and at the same time the terminals are aligned in Y direction while keeping the minimum space distance (30 μm) between each other.

The output test terminals O2 and O5 are also formed to meet the minimum width requirement for the test terminals (150 μm), and at the same time the terminals are aligned in Y direction while keeping the minimum space distance (30 μm) between each other.

The output test terminals O3 and O4 are formed to meet the minimum width requirement for the test terminals (150 μm), at the same time a width of the output lead sections connecting to the terminals is set at the minimum width, 30 μm.

Therefore, distance YW1 from the edge of the output test terminal O1 to the edge of the terminal O6 (in Y direction) is:

YW1=150 μm+30 μm×10=450 μm

Also, distance XW1 from the edge of the output test terminal O1 to the edge of the terminal O4 (in X direction) is:

XW1=150 μm×4+30 μm×3=690 μm

On the other hand, FIG. 4 shows that in the case of the conventional film carrier tape 102, the minimum width of the output test terminal 108, the minimum width and the minimum space distance of the output lead section 106 are identical to those of the film carrier tape 2.

Thus, distance YW2 from the edge of the output test terminal O1 to the edge of the terminal O8 (in Y direction) is:

YW2=150 μm×2+30 μm×13=690 μm

Also, distance XW2 from the edge of the output test terminal O1 to the edge of the terminal O4 (in X direction) is:

XW2=150 μm×4+30 μm×3=690μm

So, if distances YW1 and YW2 of block A and B in Y direction are divided into distance, yw1 and yw2, per output respectively, yw1 of the film carrier tape 2 is:

yw1=450 μm÷6 (terminals)=75 μm

On the other hand, yw2 of the film carrier tape 102 is:

yw2=690 μm÷8 (terminals)=86.25 μm

Hence the required dimension per output of the film carrier tape 2 (yw1) in the cross direction of the film carrier tape substrate 3 is 75 μm.

Meanwhile, the required dimension per output of the film carrier tape 102 (yw2) in the cross direction of the film carrier tape substrate 103 is 86.25 μm. In this manner, yw1 is smaller than yw2.

Therefore, in the arrangement of the film carrier tape 2, the required width on the film carrier tape substrate 3 to form the output test terminals 8 is narrower than that of the film carrier tape 102.

Next, on the basis of the comparison as above, widths of the film carrier tapes 2 and 102 (film carrier tape substrates 3 and 103) both mounting the liquid crystal driver LSI chip 1 including 384 output terminals for driving a liquid crystal panel (as described above) are investigated, as an example.

The conventional film carrier tape 102 requires 86.25 μm per output (yw2), thus 384 outputs need:

384×86.25 μm=33.12 mm

So the width of the film carrier tape substrate 103 must be no less than 33.12 mm.

Meanwhile, the film carrier tape 2 of this embodiment requires 75 μm per output (yw1), thus 384 outputs need:

384×75 μm=28.8 mm

Hence the width of the film carrier tape substrate 3 must be no less than 28.8 mm, i.e. only 28.8 mm width is required.

Therefore, if one tries to keep the width of the conventional film carrier tape 102 (the length in Y direction) identical with the width of the film carrier tape 2, the output test terminals 108 must be arranged in no less than five tiers in the direction of the length of the tape (in X direction).

In this case, the film carrier tape substrate 103 will be longer in X direction, and furthermore, due to the relationship with the sprocket holes 109 and 110 as described above, the length of the tape may become even longer.

As previously discussed, the number of output terminals of one liquid crystal driver LSI chip 1 driving a liquid crystal panel has become enormous, because of the increase of the number of pixels in accordance with upsizing and improvement of the resolution of the liquid crystal panel, and the demand of downsizing and cost-cutting of a liquid crystal module including the liquid crystal panel and a driver device.

So, by using the method of the present invention, the width (the length in Y direction) of the film carrier tape 3 can be made shorter than using the conventional method. In other words, more output test terminals 8 can be arranged on the conventional-size film carrier tape substrate 103.

If one tries to arrange such a great number of the output test terminals 8 on the conventional film carrier tape 102, the output test terminals must be arranged in no less than five tiers (i.e. arranging one more pair of the terminals 8 in the rearward of the terminals O1 and O5 in FIG. 4) in the direction of the length of the tape (X direction).

However, using the present invention, an abundance of the output test terminals 8 can be arranged without extending the tape in the direction of the length of the tape (X direction).

On account of this, the TCP-type liquid crystal driver can be provided at a lower price.

By the way, although the present embodiment describes the arrangement of the output test terminals 8, this embodiment can be applied to the input test terminals 7 as well, provided that the terminals 7 are much in number.

Also, the arrangement of the present invention can be applied not only to the film carrier tape 2 on which the liquid crystal driver LSI chip 1 is mounted but also to an insulating substrate mounting a display element driver unit containing many terminals or another semiconductor device, for instance an insulating film substrate having test terminals.

As described above, on the film carrier tape 2, some of the output test terminals 8 in block A are arranged side by side in the direction of a row of the output lead sections 6, so that none of the lead sections 6 being placed between the pair of the output test terminal 8.

By the way, in the present embodiment, there are two pairs of the output test terminals 8 arranged side by side in the direction of a row of the output lead sections 6 (the pair of the output test terminals O1 and O6, and the pair of the terminals O2 and O5).

On account of this, the area in the film carrier tape substrate 3 required to form the output lead sections 6 and the output test terminals 8 is reduced, and particularly the necessary length on the film carrier tape substrate 3 in the cross direction (Y direction) is shortened.

Therefore, the film carrier tape substrate 3 can be utilized efficiently. So the liquid crystal driver LSI chip 1 including multiple output terminals can be mounted on the tape substrate, while the required area of the film carrier tape substrate 3 in which the liquid crystal driver LSI chip 1 is mounted is reduced.

Hence it becomes possible to cut costs to produce the substrate on which the liquid crystal driver LSI chip 1 is mounted, i.e. TCP 4.

Moreover, as described above, the present invention can prevent the film carrier tape substrate 3 from being increased in both length and width.

Also, the output test terminals O3 and O4 are not necessarily formed to extend from one side towards the other (towards center line Z) in the direction of the row (Y direction), so these two terminals may be formed to extend in the opposite directions. Furthermore, the output test terminals O3 and O4 may be formed to extend in the opposite directions from the output lead sections 6, in the direction of the row of the output lead sections 6.

Moreover, center line Z is seen as a center line running in X direction, dividing block A into two equal parts in Y direction.

A substrate for mounting a semiconductor integrated circuit device includes:

lead sections formed on an insulating substrate, each of the lead sections such as output lead sections 6 being connected to at least one of an input terminal and an output terminal of a film carrier tape substrate 3; and test terminals 8 formed on a tip of each of output lead sections 6, wherein:

the lead sections 6 and the test terminals 8 are divided into blocks; and in each of the blocks, an outermost pair of the test terminals 8 extends inwards to oppose each other and is located relatively far from a place where the semiconductor integrated circuit device is mounted.

The arrangement above can be alternatively described to include:

lead sections formed on an insulating substrate, each of the lead sections being connected to at least one of an input terminal and an output terminal of a mounted semiconductor integrated device; and a test terminal formed on a tip of each of the lead sections, wherein:

the lead sections and the test terminals are divided into blocks; and in each of the blocks, an outermost pair of the test terminals extends inwards to oppose each other and is located relatively far from a place where the semiconductor integrated circuit device is mounted.

Furthermore, the substrate may be arranged as follows:

in the block, either a second outermost pair of the test terminals or second and succeeding outermost pairs is/are formed to oppose each other and extends/extend inwards; and the more outwards the pairs of the test terminals are arranged, the more distant the test terminals are from the place where the semiconductor integrated circuit device is mounted.

In the arrangement above, the configuration to decrease a dimension in a direction of the row of the lead sections required to form the test terminals and the lead sections on an insulating substrate is applied to multiple pairs of the test terminals.

So a per-unit price of products mounting semiconductor integrated circuit devices such as a tape carrier package can be reduced, since the insulating substrate is utilized more efficiently.

Also, the substrate for mounting a semiconductor integrated circuit device may be arranged to include so that the pair of the test terminals nearest from the place where the semiconductor integrated circuit device mounted has a minimum size usable as a test terminal in a direction of the row of the lead sections.

In the arrangement above, the pair of the test terminals nearest from the place where the semiconductor integrated circuit device being mounted has the minimum size usable as test terminals.

So, this ensures the decrease of the required dimension to form the test terminals and the lead sections on an insulating substrate, and the reduction of a per-unit price of products mounting semiconductor integrated circuit devices such as a tape carrier package.

The substrate for mounting a semiconductor integrated circuit device may be arranged so that inner test terminals are located in a direction increasingly away from a place where the semiconductor integrated circuit device is mounted, without being arranged side by side with other test terminals in the block in a direction of the row of the lead sections.

In the arrangement above, the inner test terminals are located in a direction increasingly away from a place where the semiconductor integrated circuit device is mounted, without being arranged side by side with other test terminals in a direction of the row of the lead sections.

As a result, the decrease of the required dimension in the insulating substrate can be realized regardless of the arrangement of the inner test terminals.

The substrate for mounting a semiconductor integrated circuit device may be arranged as follows:

at least in the block, the pair of the test terminals and corresponding pair of the lead sections are arranged to be substantially symmetric sections are arranged to be substantially symmetric with respect to a center line of the block running parallel to the row of the lead sections.

The arrangement above ensures the decrease of the required dimension to form the test terminals and the lead sections on an insulating substrate on account of the arrangement of the pair of the test terminals.

A substrate for mounting a semiconductor integrated circuit device of the present invention is arranged to include:

lead sections formed on an insulating substrate, each of the lead sections being connected to at least one of an input terminal and an output terminal of a mounted semiconductor integrated device; and a test terminal formed on a tip of each of the lead sections, wherein:

the lead sections and the test terminals are divided into blocks; and in each of the blocks, at least one pair of the test terminals is aligned side by side in a direction of a row of the lead sections, and the lead sections and the test terminals are arranged so that none of the lead sections are placed between the at least one pair of the test terminals.

In the arrangement above, at least one pair of the test terminals is aligned side by side in a direction of the row of the lead sections, and the lead sections and the test terminals are arranged so that none of the lead sections are placed between the at least one pair of the test terminals.

On account of this, a dimension required to form the test terminals and the lead sections on an insulating substrate can be reduced, provided that widths of the test terminals aligned side by side are adequately set.

So the insulating substrate can be utilized efficiently, and a per-unit price of products mounting semiconductor integrated circuit devices such as a tape carrier package can be reduced.

In the substrate for mounting a semiconductor integrated circuit device, the insulating film substrate may be made of an insulating film substrate, for instance a polyimide film.

Provided that the arrangement of the present invention is applied to a tape carrier package using an insulating film substrate, the arrangement can reduce required dimensions of a film carrier tape substrate and also production costs of the film carrier package.

In the substrate for mounting a semiconductor integrated circuit device, the semiconductor integrated circuit device may be a liquid crystal driver circuit device chip.

Provided that the arrangement of the present invention is applied to a substrate for mounting a semiconductor integrated circuit device on which a liquid crystal driver circuit device chip is mounted, for instance a tape carrier package, the arrangement can reduce cost of the tape carrier package and even that of a liquid crystal panel.

The substrate for mounting a semiconductor integrated circuit device may be arranged as follows:
   sprocket holes are made along both edges of the insulating substrate at intervals; and
   the semiconductor integrated circuit devices are situated also at intervals so that the first interval is an integral multiple of the second interval.

In the arrangement of the present invention, when mounted on the substrate for mounting a semiconductor integrated circuit device, the liquid crystal driver circuit device chip can be positioned precisely.

In the substrate for mounting a semiconductor integrated circuit device, the lead sections may be formed by laminating an electrolytic copper foil on the insulating substrate with an adhesion layer intervening between the foil and the insulating substrate, or by laminating an electrolytic copper foil directly on the insulating substrate.

The substrate for mounting a semiconductor integrated circuit device includes:
   lead sections connected to at least either an input terminal or an output terminal of a mounted semiconductor integrated circuit device, and arranged in one direction on the insulating substrate; and
   a test terminal formed on a tip of each of the lead sections, wherein:
   the lead sections and the test terminals are divided into blocks; and
   in each of the blocks, an outermost pair of the lead sections is the longest, and lengths of other lead sections gradually decrease with a distance from the outermost pair of the lead sections; and
   the test terminals formed on tips of the lead sections are arranged to extend inwards.

The substrate for mounting a semiconductor integrated circuit device may be arranged to include the test terminals being arranged between the outermost pair of the lead sections, in multiple tiers towards the semiconductor integrated circuit device.

Also, the substrate for mounting a semiconductor integrated circuit device may be arranged so that among the test terminals arranged in multiple tiers, those test terminals connected to the outermost pair of the lead sections extend inwards to oppose each other.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A substrate for mounting a semiconductor integrated circuit device, comprising:
   lead sections formed on an insulating substrate, each of the lead sections being connected to at least one of an input terminal and an output terminal of a mounted semiconductor integrated device; and
   a test terminal formed on a tip of each of the lead sections, wherein:
   the lead sections and the test terminals are divided into blocks; and
   in each of the blocks, an outermost pair of the test terminals extends inwards to oppose each other and is located relatively far from a place where the semiconductor integrated circuit device is mounted.

2. The substrate as set forth in claim 1, wherein:
   in the block, either a second outermost pair of the test terminals or second and succeeding outermost pairs is/are formed to oppose each other and extends/extend inwards; and
   the more outwards the pairs of the test terminals are arranged, the more distant the test terminals are from the place where the semiconductor integrated circuit device is mounted.

3. The substrate as set forth in claim 1, wherein:
   a pair of the test terminals nearest from the place where the semiconductor integrated circuit device is mounted has a minimum size usable as a test terminal in a direction of a row of the lead sections.

4. The substrate as set forth in claim 1, wherein:
   inner test terminals are located in a direction increasingly away from a place where the semiconductor integrated circuit device, without being arranged side by side with other test terminals in the block in a direction of the row of the lead sections.

5. The substrate as set forth in claim 1, wherein:
   at least in the block, the pair of the test terminals and corresponding pair of the lead sections are arranged to be substantially symmetric with respect to a center line of the block running parallel to the row of the lead sections.

6. The substrate for mounting a semiconductor integrated circuit device, comprising:
   lead sections formed on an insulating substrate, each of the lead sections being connected to at least one of an input terminal and an output terminal of a mounted semiconductor integrated device; and a test terminal formed on a tip of each of the lead sections, wherein:

the lead sections and the test terminals are divided into blocks; and in each of the blocks, at least one pair of the test terminals is aligned side by side in a direction of a row of the lead sections, and the lead sections and the test terminals are arranged so that none of the lead sections are placed between the at least one pair of the test terminals.

7. The substrate as set forth in claim 1, wherein:

the insulating substrate is an insulating film substrate.

8. The substrate as set forth in claim 7, wherein:

the insulating film substrate is made of a polyimide film.

9. The substrate as set forth in claim 1, wherein:

the semiconductor integrated circuit device is a liquid crystal driving circuit device chip.

10. The substrate as set forth in claim 1, wherein:

sprocket holes are made along both edges of the substrate at intervals; and the semiconductor integrated circuit devices are situated also at intervals so that the first interval is an integral multiple of the second interval.

11. The substrate as set forth in claim 1, wherein:

the lead sections are formed by laminating an electrolytic copper foil on the insulating substrate with an adhesion layer intervening between the foil and the insulating substrate.

12. The substrate as set forth in claim 1, wherein:

the lead sections are formed by laminating an electrolytic copper foil directly on the insulating substrate.

13. A substrate for mounting a semiconductor integrated circuit device, comprising:

lead sections connected to at least either an input terminal or an output terminal of a mounted semiconductor integrated circuit device, and arranged in one direction on an insulating substrate; and a test terminal formed on a tip of each of the lead sections, wherein:

the lead sections and the test terminals are divided into blocks; and in each of the blocks, an outermost pair of the lead sections is the longest, and lengths of other lead sections gradually decrease with a distance from the outermost pair of the lead sections; and the test terminals formed on tips of the lead sections are arranged to extend inwards.

14. The substrate as set forth in claim 13, wherein:

the test terminals are arranged in multiple tiers towards the semiconductor integrated circuit device between the outermost pair of the lead sections.

15. The substrate as set forth in claim 14, wherein:

among the test terminals arranged in multiple tiers, those connected to the outermost pair of the lead sections extend inwards to oppose each other.

* * * * *